(12) United States Patent
Li

(10) Patent No.: US 12,148,695 B2
(45) Date of Patent: Nov. 19, 2024

(54) FUSE STRUCTURE AND MANUFACTURING METHOD THEREOF

(71) Applicant: CHANGXIN MEMORY TECHNOLOGIES, INC., Hefei (CN)

(72) Inventor: Xiong Li, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 609 days.

(21) Appl. No.: 17/516,640

(22) Filed: Nov. 1, 2021

(65) Prior Publication Data

US 2022/0375857 A1 Nov. 24, 2022

Related U.S. Application Data

(63) Continuation of application No. PCT/CN2021/120280, filed on Sep. 24, 2021.

(30) Foreign Application Priority Data

May 20, 2021 (CN) .......................... 202110553275.8

(51) Int. Cl.
  *H01L 23/525* (2006.01)
  *H10B 20/25* (2023.01)
(52) U.S. Cl.
  CPC ......... *H01L 23/5256* (2013.01); *H10B 20/25* (2023.02)

(58) Field of Classification Search
  CPC .......................... H01L 23/5256; H10B 20/25
  See application file for complete search history.

(56) References Cited

U.S. PATENT DOCUMENTS

| 10,056,391 B2 | 8/2018 | Adusumilli et al. |
| 2015/0255469 A1 | 9/2015 | Choi et al. |
| 2021/0183872 A1* | 6/2021 | Lai .......................... G11C 17/16 |

FOREIGN PATENT DOCUMENTS

| CN | 1499627 A | 5/2004 |
| CN | 102237337 A | 11/2011 |
| CN | 104701296 A | 6/2015 |
| CN | 106449516 A | 2/2017 |
| CN | 107256855 B | 7/2019 |
| CN | 111261612 A | 6/2020 |

* cited by examiner

*Primary Examiner* — Daniel P Shook
(74) *Attorney, Agent, or Firm* — Kilpatrick Townsend & Stockton LLP

(57) ABSTRACT

A fuse structure and a manufacturing method thereof are provided. The fuse structure includes: a substrate; an active region positioned above the substrate; a fuse gate structure surrounding a circumferential outer surface of the active region and electrically connected to a first power source; and a control gate structure surrounding a circumferential outer surface of the fuse gate structure and electrically connected to a second power source. A voltage of the first power source is greater than that of the second power source.

20 Claims, 3 Drawing Sheets

FUSE STRUCTURE AND MANUFACTURING METHOD THEREOF

CROSS-REFERENCE TO RELATED APPLICATION

This application is a continuation of PCT/CN2021/120280, filed on Sep. 24, 2021, which claims priority to Chinese Patent Application No. 2021105532758 titled "FUSE STRUCTURE AND MANUFACTURING METHOD THEREOF" and filed on May 20, 2021, the entire contents of which are incorporated herein by reference.

TECHNICAL FIELD

The present disclosure relates to a fuse structure and a manufacturing method thereof.

BACKGROUND

A fuse memory cell is widely used for repair work in integrated circuits, and its classic structures include control gate structures and discrete fuse gate structures.

SUMMARY

According to a plurality of embodiments, a first aspect of the present disclosure provides a fuse structure, which includes:
 a substrate;
 an active region positioned above the substrate;
 a fuse gate structure surrounding a circumferential outer surface of the active region and electrically connected to a first power source; and
 a control gate structure surrounding a circumferential outer surface of the fuse gate structure and electrically connected to a second power source.
 A voltage of the first power source is greater than that of the second power source.
 A method for manufacturing a fuse structure includes:
 providing a substrate;
 forming an active region above the substrate;
 forming a fuse gate structure on a circumferential outer surface of the active region, the fuse gate structure being electrically connected to a first power source; and
 forming a control gate structure on a circumferential outer surface of the fuse gate structure, the control gate structure being electrically connected to a second power source.
 A voltage of the first power source is greater than that of the second power source.
 Details of one or more embodiments of the present disclosure are set forth in the following drawings and descriptions. Other features and advantages of the present disclosure will become apparent from specification, drawings and claims.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

REFERENCE NUMBERS IN THE ACCOMPANYING DRAWINGS

Figure 1:
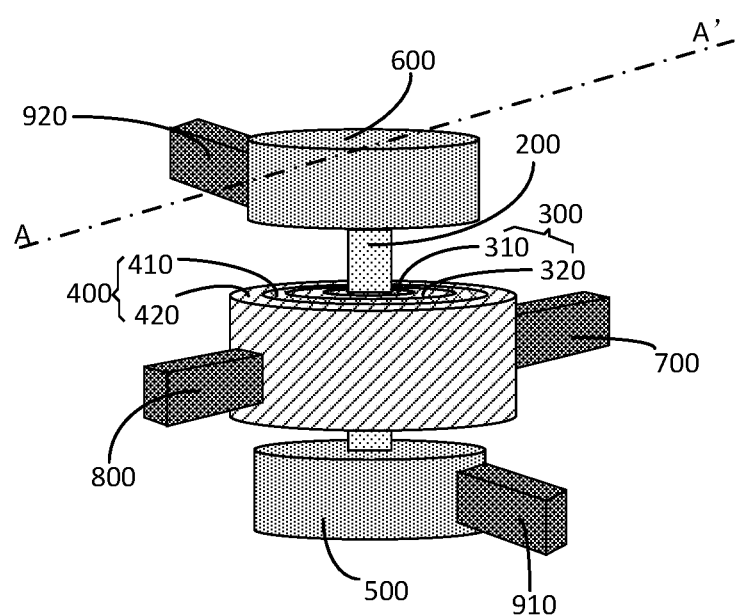
FIG. 1 is a three-dimensional schematic diagram of a fuse structure according to an embodiment.

100—substrate; 200—active region; 300—fuse gate structure; 310—first gate dielectric layer; 320—fuse gate layer; 400—control gate structure; 410—second gate dielectric layer; 420—control gate layer; 500—source region; 600—drain region; 700—fuse connection end; 800—control connection end, 910—source connection end; and 920—drain connection end.

DETAILED DESCRIPTION

Limited by design rules between two gate structures, the fuse structure described in the background art has a problem of overlarge area. As integration of integrated circuits continues to increase, disadvantages of the overlarge area will gradually appear.

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided so that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present. It should be understood that although the terms first, second, third, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Therefore, without departing from the teachings of the present disclosure, a first element, component, region, layer, doping type, or section discussed below may be represented as a second element, component, region, layer, doping type, or section.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should also be understood that the terms "comprising" and/or "including", when used in this specification, may determine the presence of the described features, integers, steps, operations, elements and/or components, but do not preclude the presence or addition of one or more other features, integers, steps, operations, elements, components, and/or groups thereof. Meanwhile, as used herein, the term "and/or" includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, the embodiments of the present disclosure should not be construed as being limited to particular shapes of regions illustrated herein but may include deviations in shapes that result, for example, from the manufacturing techniques. Thus, regions illustrated in the figures are schematic in nature and their shapes do not necessarily illustrate the actual shape of a region of the device and do not limit the scope of the present disclosure.

Figure 2:
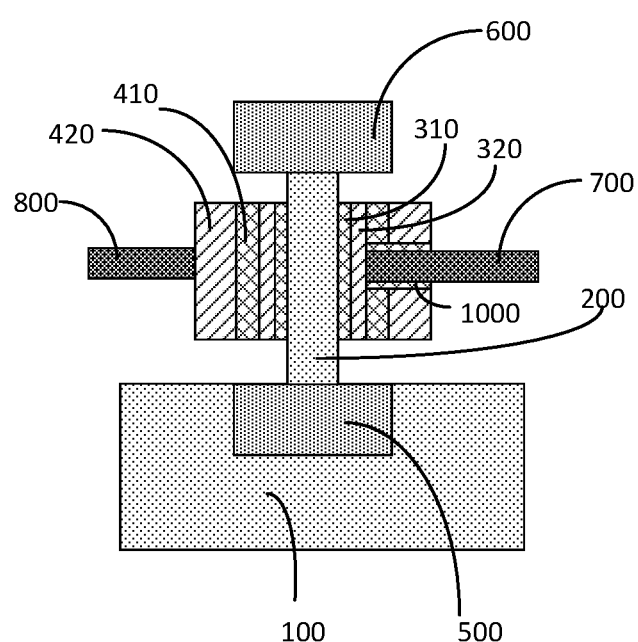
FIG. 2 is a schematic cross-sectional view of the fuse structure provided in FIG. 1 along an AA' direction.

Referring to FIG. 1 and FIG. 2 (or referring to FIG. 3 and FIG. 4), the present disclosure provides a fuse structure, which includes a substrate 100, an active region 200, a fuse gate structure 300, and a control gate structure 400.

The substrate 100 includes, but is not limited to, a silicon substrate. The active region 200 is positioned above the substrate 100, and a material of the active region 200 may be the same as a material of the substrate 100 or may be different from the material of the substrate 100, which is not limited in the present disclosure. In some embodiments, the material of the active region 200 may be silicon, silicon germanium, silicon carbide, or the like.

As an example, referring to FIG. 1 and FIG. 2, an extension direction of the active region 200 may be perpendicular to a surface of the substrate 100. Moreover, the active region 200 may be connected to the substrate 100.

At this moment, a source region 500 (or a drain region 600) may be first formed in the substrate 100, and then the active region 200 is formed upward from the source region 500 (or the drain region 600). Next, the drain region 600 (or the source region 500) is formed on a top of the active region 200.

Figure 3:
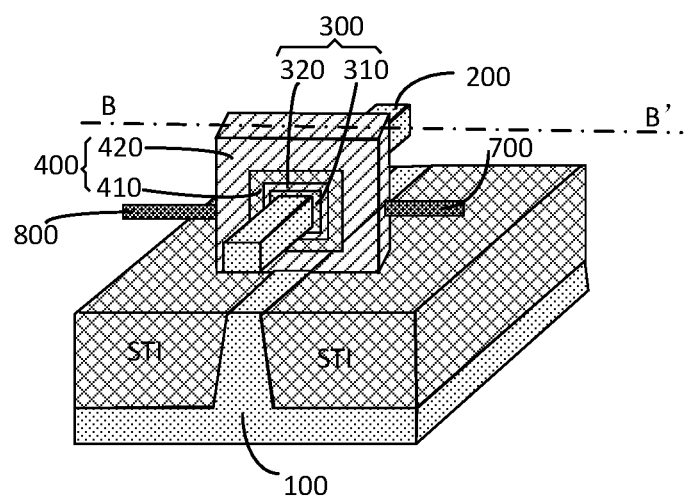
FIG. 3 is a three-dimensional schematic diagram of a fuse structure according to another embodiment.
Figure 4:
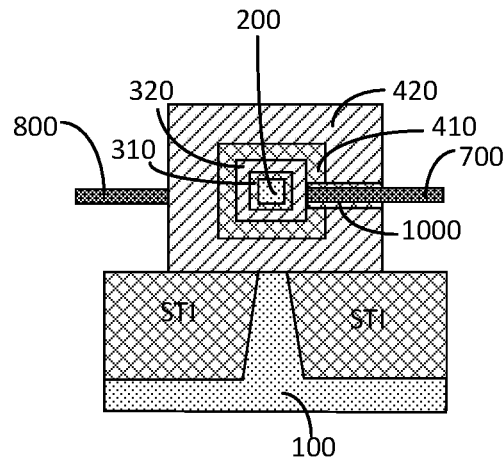
FIG. 4 is a schematic cross-sectional view of the fuse structure provided in FIG. 1 along a BB' direction.

As another example, referring to FIG. 3 and FIG. 4, the extension direction of the active region 200 may be parallel to the surface of the substrate 100. Moreover, the active region 200 may be spaced apart from the substrate 100.

At this moment, a fin-shaped region may be formed in the substrate 100. Two sides of the fin-shaped region may be respectively provided with a shallow trench isolation (STI) structure, wherein a material of the STI structure may be silicon dioxide or the like. The active region 200 may be positioned above the fin-shaped region.

In addition, at this moment, epitaxial growth may be performed on two sides of the active region 200 to form the source region 500 and the drain region 600.

Of course, there may be more forms for arranging the active region 200 above the substrate 100 (for example, the extension direction of the active region 200 may also be at a certain oblique angle to the surface of the substrate 100), on which no excessive restrictions are imposed in the present disclosure. In addition, there may be a variety of ways to form the source region 500 and the drain region 600. For example, the fuse gate structure 300 and the control gate structure 400 at least cover a part of the active region 200, and two ends of the uncovered active region 200 may also be doped to form the source region 500 and the drain region 600.

The fuse gate structure 300 surrounds a circumferential outer surface of the active region 200, and the control gate structure 400 surrounds a circumferential outer surface of the fuse gate structure 300. Here, it may be understood that both the fuse gate structure 300 and the control gate structure 400 are insulated from the source region 500 and the drain region 600 on two sides. In some embodiments, an insulating layer may be respectively provided between the fuse gate structure 300 and the control gate structure 400 and the source region 500 and the drain region 600 on two sides.

In addition, the fuse gate structure 300 surrounds the circumferential outer surface of the active region 200, and the control gate structure 400 surrounds the circumferential outer surface of the fuse gate structure 300. Therefore, the fuse gate structure 300 and the control gate structure 400 jointly control formation of a conductive channel in the active region 200. In some embodiments, the conductive channel may be positioned near a circumferential outer surface of the active region 200.

Furthermore, the fuse gate structure 300 is electrically connected to a first power source, and the control gate structure 400 is electrically connected to a second power source, wherein a voltage of the first power source is greater than that of the second power source.

When the fuse gate structure 300 receives the voltage of the first power source, the fuse gate structure 300 may be broken down because the voltage is relatively large. Electrical conductivity of the fuse gate structure 300 broken down is changed, which in turn changes a size of the conductive channel formed in the active region 200, such that a magnitude of the source-drain current flowing through the conductive channel may be changed.

In this way, discrimination between "0" and "1" may be realized by controlling ON and OFF of the first power source.

In some embodiments, in an application process of the fuse structure, reading different logic states "0" and "1" of the fuse structure may be implemented by controlling ON and OFF of the first power source.

In addition, a reasonable second power source may be set, such that when various logic states of the fuse structure are read to turn on the second power source, the conductive channel is formed in the active region 200, and then the logic states "0" and "1" are read based on different source-drain currents.

It is worth noting that in the present disclosure, the fuse gate structure 300 being electrically connected to the first power source means that the fuse gate structure 300 has the function of electrically connecting the first power source. However, in practical applications, it is needed to determine whether to obtain electrical signal connection according to requirements. In some embodiments, a first switch may be provided between the fuse gate structure 300 and the first power source.

Similarly, the control gate structure 400 being electrically connected to the second power source means that the control gate structure 400 has the function of electrically connecting the second power source. However, in practical applications, it is needed to determine whether to obtain electrical signal connection according to requirements. In some embodiments, a second switch may be provided between the control gate structure 400 and the second power source.

In this embodiment, the fuse gate structure 300 surrounds the circumferential outer surface of the active region 200, and the control gate structure 400 surrounds the circumferential outer surface of the fuse gate structure 300, such that the conductive channel may be formed in the circumferential outer surface of the active region 200, and thus area can be effectively saved. Meanwhile, the control gate structure 400 and the fuse gate structure 300 are stacked and arranged around, thereby being combined into a single gate structure, so this embodiment can greatly save area and greatly improve integration of a fuse circuit.

In one embodiment, referring to FIG. 2 or FIG. 4, the fuse gate structure 300 includes a first gate dielectric layer 310 and a fuse gate layer 320. The first gate dielectric layer 310 may be an insulating layer such as an oxide, and the first gate dielectric layer 310 surrounds the circumferential outer surface of the active region 200. The fuse gate layer 320 may be a conductive layer such as polysilicon, and the fuse gate layer 320 surrounds a circumferential outer surface of the first gate dielectric layer 310 and is electrically connected to the first power source.

When the fuse gate layer 320 receives the voltage of the first power source, the first gate dielectric layer 310 surrounded and covered by the fuse gate layer 320 is broken down by a first gate voltage, such that resistance of the first gate dielectric layer 310 decreases, and thus a source-drain current increases.

The control gate structure 400 includes a second gate dielectric layer 410 and a control gate layer 420. The second gate dielectric layer 410 may be an insulating layer such as an oxide, and the second gate dielectric layer 410 surrounds a circumferential outer surface of the fuse gate layer 320. The control gate layer 420 may be a conductive layer such as polysilicon, and the control gate layer 420 surrounds a circumferential outer surface of the second gate dielectric layer 410 and is electrically connected to the second power source.

When the control gate layer 420 receives the voltage of the second power source, a conductive channel in the active region 200 is formed.

It may be understood that a material of the first gate dielectric layer 310 may be the same as or different from a material of the second gate dielectric layer 410, which is not limited in the present disclosure. A material of the control gate layer 420 may be the same as or different from a material of the fuse gate layer 320, which is also not limited in the present disclosure.

In addition, the first gate dielectric layer 310, the second gate dielectric layer 410, the fuse gate layer 320 and the control gate layer 420 may be a single-layer film layer structure or a multiple-layer film layer structure, which may be set according to actual needs. For example, the second gate dielectric layer 410 may include a high-K dielectric layer such as hafnium oxide. In this case, the control gate layer 420 may include a plurality of stacked metal layers.

Moreover, in addition to the second gate dielectric layer 410 and the control gate layer 420, the control gate structure 400 may also include other functional film layers. In addition to the first gate dielectric layer 310 and the fuse gate layer 320, the fuse gate structure 300 may also include other functional film layers. However, the present disclosure is not limited thereto.

Further, in this embodiment, a thickness of the second gate dielectric layer 410 may be greater than that of the first gate dielectric layer 310.

Because the second gate dielectric layer 410 and the first gate dielectric layer 310 are respectively positioned on two sides of the fuse gate layer 320, when the first gate dielectric layer 310 is broken down due to the fuse gate layer 320 receiving a voltage signal of the first power source, the second gate dielectric layer 410 may inevitably be adversely impacted.

In this embodiment, by setting the thickness of the second gate dielectric layer 410 to be greater than that of the first gate dielectric layer 310, the adverse impact on the second gate dielectric layer 410 when the first gate dielectric layer 310 is broken down can be effectively reduced.

As an example, the thickness of the first gate dielectric layer 310 may be set 1.5 nm to 2.5 nm, and the thickness of the second gate dielectric layer 410 may be set 4.5 nm to 6 nm. In this way, it may be ensured that the second gate dielectric layer 410 is not to be damaged in the process of breaking down and fusing the first gate dielectric layer 310, thereby ensuring reliability of products. At this moment, a voltage range of the first power source may be further set to 5V-6V, and a voltage range of the second power source may be set to 2V-3V.

Of course, in other embodiments, the second gate dielectric layer 410 may also be protected in other ways. For example, a dielectric constant of the second gate dielectric layer 410 may be set to be greater than that of the first gate dielectric layer 310.

In one embodiment, referring to FIG. 1 and FIG. 2 (or referring to FIG. 3 and FIG. 4), the fuse structure also includes a fuse connection end 700 and a control connection end 800. The fuse connection end 700 is connected to the fuse gate layer 320 to electrically connect the first power source. The control connection end 800 is connected to the control gate layer 420 to electrically connect the second power source.

The fuse connection end 700 and the control connection end 800 are respectively positioned on two opposite sides of the active region 200, which may effectively prevent signal coupling interference between the fuse connection end 700 and the control connection end 800.

Further, extension directions of the fuse connection end 700 and of the control connection end 800 may be set to be perpendicular to the extension direction of the active region 200.

In this case, the fuse connection end 700 and the control connection end 800 are far away from the source region 500 and the drain region 600 on the two sides of the active region 200, such that signal interference to the source region 500 and the drain region 600 may be reduced.

In some embodiments, referring to FIG. 1 and FIG. 2, when the extension direction of the active region 200 is perpendicular to the surface of the substrate 100, and the active region 200 is connected to the substrate 100, the fuse connection end 700 and the control connection end 800 may be set to extend in a horizontal direction, and the fuse connection end 700 and the control connection end 800 may be positioned on two opposite sides of the active region 200, respectively.

In this case, the fuse structure may also be provided with a source connection end 910 connected to the source region 500 and a drain connection end 920 connected to the drain region 600. Horizontal extension directions of the fuse connection end 700, the control connection end 800, the source connection end 910 and the drain connection end 920 may be perpendicular to each other.

Referring to FIG. 3 and FIG. 4, when the extension direction of the active region 200 is parallel to the surface of the substrate 100, and the active region 200 is spaced apart from the substrate 100, the fuse connection end 700 and the control connection end 800 may be set to extend along a direction on a horizontal plane perpendicular to the extension direction of the active region 200. In some embodiments, the fuse connection end 700 and the control connection end 800 may also be set to extend upward in a vertical direction (not shown), and so on.

It is to be understood here that while the fuse connection end 700 is connected to the fuse gate layer 320, the fuse connection end 700 is insulated and isolated from the control connection end 800. In some embodiments, an isolation layer 1000 may be provided between the fuse connection end 700 and the control connection end 800 (referring to FIG. 2 or FIG. 4). In this case, a thickness of the isolation layer 1000 may be set to be greater than a preset thickness. That is, the isolation layer 1000 is set to have a sufficiently large thickness, to prevent the adverse impact on the second gate dielectric layer 410 when the first gate dielectric layer 310 is broken down. The preset thickness may be set according to actual situation.

Figure 5:
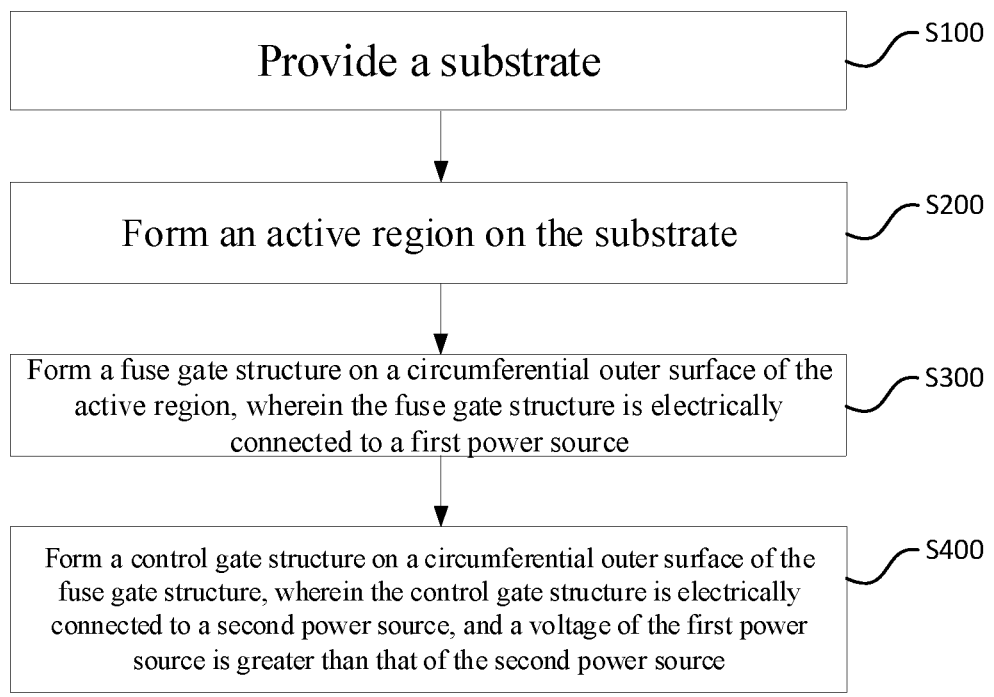
FIG. 5 is a flowchart of a method for manufacturing a fuse structure according to an embodiment.

In one embodiment, referring to FIG. 5, there is provided a method for manufacturing a fuse structure, including:

Step S100: providing a substrate 100;

Step S200: forming an active region 200 on the substrate 100;

Step S300: forming a fuse gate structure 300 on a circumferential outer surface of the active region 200, wherein the fuse gate structure 300 is electrically connected to a first power source; and Step S400: forming a control gate structure 400 on a circumferential outer surface of the fuse gate structure 300, wherein the control gate structure 400 is electrically connected to a second power source.

A voltage of the first power source is greater than that of the second power source.

In some embodiments, in an application process of the fuse structure formed by means of the method of this embodiment, reading different logic states "0" and "1" of the fuse structure may be implemented by controlling ON and OFF of the first power source.

In addition, a reasonable second power source may be set, such that when various logic states of the fuse structure are read to turn on the second power source, a conductive channel is formed in the active region 200, and then the logic states "0" and "1" are read based on different source-drain currents.

It is worth noting that in the present disclosure, the fuse gate structure 300 being electrically connected to the first power source means that the fuse gate structure 300 has the function of electrically connecting the first power source. However, in practical applications, it is needed to determine whether to obtain electrical signal connection according to requirements. In some embodiments, a first switch may be provided between the fuse gate structure 300 and the first power source.

Similarly, the control gate structure 400 being electrically connected to the second power source means that the control gate structure 400 has the function of electrically connecting the second power source. However, in practical applications, it is needed to determine whether to obtain electrical signal connection according to requirements. In some embodiments, a second switch may be provided between the control gate structure 400 and the second power source.

In this embodiment, the fuse gate structure 300 surrounds the circumferential outer surface of the active region 200, and the control gate structure 400 surrounds the circumferential outer surface of the fuse gate structure 300, such that the conductive channel may be formed in the circumferential outer surface of the active region 200, and thus area can be effectively saved. Meanwhile, the control gate structure 400 and the fuse gate structure 300 are stacked and arranged around, thereby being combined into a single gate structure, so this embodiment can greatly save area and greatly improve integration of a fuse circuit.

In one embodiment, the extension direction of the active region 200 is perpendicular to the surface of the substrate 100, and the active region 200 is connected to the substrate 100.

In this case, in some embodiments, before Step S200, the method may include: forming a source region 500 (or a drain region 600) in the substrate 100 by means of ion implantation or the like. Next, the active region 200 is formed on the source region 500 (or the drain region 600) in Step S200. After Step S200, the drain region 600 (or the source region 500) may be formed on a top of the active region 200.

In one embodiment, the extension direction of the active region 200 is parallel to the surface of the substrate 100, and the active region 200 is spaced apart from the substrate 100.

In this case, in some embodiments, after Step S200, epitaxial growth may be performed on two sides of the active region 200 to form the source region 500 and the drain region 600.

In one embodiment, Step S300 includes:

Step S310: forming a first gate dielectric layer 310 on the circumferential outer surface of the active region 200; and Step S320: forming a fuse gate layer 320 on a circumferential outer surface of the first gate dielectric layer 310, wherein the fuse gate layer 320 and the first gate dielectric layer 310 constitute the fuse gate structure 300.

In this case, Step S400 includes:

Step S410: forming a second gate dielectric layer 410 on a circumferential outer surface of the fuse gate layer 320; and Step S420: forming a control gate layer 420 on a circumferential outer surface of the second gate dielectric layer 410, wherein the control gate layer 420 and the second gate dielectric layer 410 constitute the control gate structure 400.

In one embodiment, the thickness of the first gate dielectric layer 310 is smaller than that of the second gate dielectric layer 410.

In one embodiment, after Step S420, the method also includes:

Step S500: forming a fuse connection end 700 connected to the fuse gate layer 320, wherein the fuse connection end 700 is configured to electrically connect the first power source; and Step S600: forming a control connection end 800 connected to the control gate layer 420, wherein the control connection end 800 is configured to electrically connect the second power source.

The fuse connection end 700 and the control connection end 800 are respectively positioned on two opposite sides of the active region 200.

In one embodiment, an extension direction of the fuse connection end 700 and an extension direction of the control connection end 800 are perpendicular to the extension direction of the active region 200.

Reference may be made to the limitations on the fuse structure for limitations and technical effects of the method for manufacturing a fuse structure, and thus their detailed descriptions are omitted here.

It is to be understood that although the various steps in the flowchart of FIG. 5 are displayed in sequence as indicated by the arrows, these steps are not necessarily performed in sequence in the order indicated by the arrows. It should be understood that unless expressly stated herein, the execution of these steps is not strictly limited in sequence, and these steps may be performed in other orders. Moreover, at least a part of the steps in FIG. 5 may include a plurality of steps or a plurality of stages, which are not necessarily performed at the same moment, but may be executed at different moments, and the order of execution of these steps or stages is not necessarily performed sequentially, but may be performed alternately or alternately with at least a part of the steps or stages of other steps or other steps.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A fuse structure, comprising:
    a substrate;
    an active region positioned above the substrate;
    a fuse gate structure surrounding a circumferential outer surface of the active region and electrically connected to a first power source; and
    a control gate structure surrounding a circumferential outer surface of the fuse gate structure and electrically connected to a second power source;
    wherein, a voltage of the first power source is greater than that of the second power source.

2. The fuse structure according to claim 1, wherein an extension direction of the active region is perpendicular to a surface of the substrate, and the active region being connected to the substrate.

3. The fuse structure according to claim 1, wherein an extension direction of the active region is parallel to a surface of the substrate, and the active region being spaced apart from the substrate.

4. The fuse structure according to claim 1, wherein
    the fuse gate structure comprises a first gate dielectric layer and a fuse gate layer, the first gate dielectric layer surrounding the circumferential outer surface of the active region, the fuse gate layer surrounding a circumferential outer surface of the first gate dielectric layer and being electrically connected to the first power source; and
    the control gate structure comprises a second gate dielectric layer and a control gate layer, the second gate dielectric layer surrounding a circumferential outer surface of the fuse gate layer, the fuse gate layer surrounding a circumferential outer surface of the second gate dielectric layer and being electrically connected to the second power source.

5. The fuse structure according to claim 4, wherein a thickness of the first gate dielectric layer is smaller than that of the second gate dielectric layer.

6. The fuse structure according to claim 4, wherein
    the fuse structure further comprises a fuse connection end and a control connection end, the fuse connection end being connected to the fuse gate layer and being configured to electrically connect the first power source, the control connection end being connected to the control gate layer and being configured to electrically connect the second power source; and
    the fuse connection end and the control connection end are respectively positioned on two opposite sides of the active region.

7. The fuse structure according to claim 6, wherein an extension direction of the fuse connection end and an extension direction of the control connection end are perpendicular to the extension direction of the active region.

8. The fuse structure according to claim 1 further comprising a source region and a drain region, wherein in the extension direction of the active region, the source region and the drain regions are respectively connected to two sides of the active region.

9. A method for manufacturing a fuse structure, comprising:
    providing a substrate;
    forming an active region above the substrate;
    forming a fuse gate structure on a circumferential outer surface of the active region, the fuse gate structure being electrically connected to a first power source; and
    forming a control gate structure on a circumferential outer surface of the fuse gate structure, the control gate structure being electrically connected to a second power source;
    wherein, a voltage of the first power source is greater than that of the second power source.

10. The method for manufacturing a fuse structure according to claim 9, wherein an extension direction of the active region is perpendicular to a surface of the substrate, the active region being connected to the substrate.

11. The method for manufacturing a fuse structure according to claim 9, wherein an extension direction of the active region is parallel to a surface of the substrate, the active region being spaced apart from the substrate.

12. The method for manufacturing a fuse structure according to claim 9, wherein
the forming a fuse gate structure on a circumferential outer surface of the active region comprises:
forming a first gate dielectric layer on the circumferential outer surface of the active region;
forming a fuse gate layer on a circumferential outer surface of the first gate dielectric layer, the fuse gate layer and the first gate dielectric layer constituting the fuse gate structure; and
the forming a control gate structure on a circumferential outer surface of the fuse gate structure comprises:
forming a second gate dielectric layer on a circumferential outer surface of the fuse gate layer; and
forming a control gate layer on a circumferential outer surface of the second gate dielectric layer, the control gate layer and the second gate dielectric layer constituting the control gate structure.

13. The method for manufacturing a fuse structure according to claim 12, wherein a thickness of the first gate dielectric layer is smaller than that of the second gate dielectric layer.

14. The method for manufacturing a fuse structure according to claim 12, wherein after forming a control gate layer on a circumferential outer surface of the second gate dielectric layer, the method further comprises:
forming a fuse connection end connected to the fuse gate layer, the fuse connection end being configured to electrically connect the first power source; and
forming a control connection end connected to the control gate layer, the control connection end being configured to electrically connect the second power source;
wherein the fuse connection end and the control connection end are respectively positioned on two opposite sides of the active region.

15. The method for manufacturing a fuse structure according to claim 14, wherein an extension direction of the fuse connection end and an extension direction of the control connection end are perpendicular to the extension direction of the active region.

16. The method for manufacturing a fuse structure according to claim 9, wherein before forming the active region above the substrate, the method further comprises:
forming a source region in the substrate by means of ion implantation;
the forming the active region above the substrate comprises:
forming the active region on the source region.

17. The method for manufacturing a fuse structure according to claim 16, wherein after forming the active region above the substrate, the method further comprises:
forming a drain region on a top of the active region.

18. The method for manufacturing a fuse structure according to claim 17, after forming the active region above the substrate, the method further comprises:
performing epitaxial growth on two sides of the active region to form the source region and the drain region.

19. The method for manufacturing a fuse structure according to claim 9, wherein before forming the active region above the substrate, the method further comprises:
forming a drain region in the substrate by means of ion implantation; and
the forming the active region above the substrate comprises:
forming the active region on the drain region.

20. The method for manufacturing a fuse structure according to claim 19, wherein after forming the active region above the substrate, the method further comprises:
forming a source region on a top of the active region.

* * * * *